United States Patent [19]

Schulze et al.

[11] Patent Number: 4,820,656

[45] Date of Patent: Apr. 11, 1989

[54] METHOD FOR PRODUCING A P-DOPED SEMICONDUCTOR REGION IN AN N-CONDUCTIVE SEMICONDUCTOR BODY

[75] Inventors: Hans-Joachim Schulze, Anzing; Reinhold Kuhnert, Munich, both of Fed. Rep. of Germany

[73] Assignee: Siemens Aktiengesellschaft, Berlin and Munich, Fed. Rep. of Germany

[21] Appl. No.: 86,914

[22] Filed: Aug. 19, 1987

[30] Foreign Application Priority Data

Sep. 30, 1986 [DE] Fed. Rep. of Germany ....... 3633299

[51] Int. Cl.[4] .................. H01L 21/223; H01L 21/383
[52] U.S. Cl. ..................................... 437/169; 437/165; 437/151; 437/143
[58] Field of Search ................ 437/143, 151, 165, 169

[56] References Cited

U.S. PATENT DOCUMENTS

| 3,205,102 | 9/1965 | McCaldin | 437/169 X |
| 3,377,216 | 4/1968 | Raithel | 437/169 X |
| 3,577,287 | 5/1971 | Norwich et al. | 437/143 |
| 3,615,945 | 10/1971 | Yokozawa | 437/151 X |
| 3,805,734 | 4/1974 | Dietze | 437/169 X |
| 3,852,128 | 12/1974 | Kreuzer | 437/169 |
| 4,193,826 | 3/1980 | Mochizuki et al. | 437/169 X |
| 4,235,650 | 11/1980 | Chang et al. | 437/143 |
| 4,239,560 | 12/1980 | Chang et al. | 437/143 |
| 4,381,957 | 5/1983 | Punter et al. | 437/151 X |
| 4,720,469 | 1/1988 | Keser et al. | 437/143 |

OTHER PUBLICATIONS

Rosnowski, W., *J. Electrochem. Soc.*, "Aluminum Diffusion into Silicon in an Open Tube High Vacuum System," vol. 125, No. 6, Jun. 1978, pp. 957–962.

Warner, Jr., R. M. et al., Integrated Circuits: Design Principles and Fabrication, McGraw-Hill Book Co., N.Y., N.Y., 1965, pp. 293–295.

*Primary Examiner*—Brian E. Hearn
*Assistant Examiner*—M. Wilczewski
*Attorney, Agent, or Firm*—Hill, Van Santen, Steadman & Simpson

[57] ABSTRACT

A method for producing a p-doped semiconductor region in an n-conductive semiconductor body by means of diffusion using a combination of both aluminum and boron as dopants. The semiconductor body is positioned within a hollow silicon member which itself is located within a refractory tube. The refractory tube is evacuated to a very low pressure and then the interior of the tube is heated for a time and at a temperature sufficient to diffuse both aluminum and boron into the semiconductor body.

4 Claims, 1 Drawing Sheet

METHOD FOR PRODUCING A P-DOPED SEMICONDUCTOR REGION IN AN N-CONDUCTIVE SEMICONDUCTOR BODY

BACKGROUND OF THE INVENTION

1. Field of the Invention

The present invention is directed to a method for producing a p-doped semiconductor region in an n-conductive semiconductor body through joint diffusion of aluminum and boron under controlled conditions.

2. Description for the Prior Art

A method of the type herein described is known from J. Electrochem. Soc. Volume 125, No. 6, June 1978, pages 957–962. In the method described in that article, a plurality of wafer shaped semiconductor bodies is introduced into a quartz tube together with a plurality of dopant sources composed of aluminum blocks. The quartz tube is connected to a vacuum pump which evacuates it down to at least $10^{-6}$ Torr. Subsequently, a diffusion furnace is mounted over the evacuated quartz tube and the latter is exposed to a diffusion temperature of, for example, 1150° C. over a predetermined time interval. The disadvantage of this procedure is that the inside wall of the quartz tube must first be passivated in order to prevent a lowering of the partial aluminum pressure during the diffusion as a result of the influences of the quartz tube on the liberated aluminum vapor. A separate method step is required wherein a plurality of dopant sources are introduced into the quartz tube and, following a prior evacuation, the tube is exposed to a temperature of 1100° C. over a time interval of about 120 minutes. The aluminum molecules emerging from the dopant sources permit a passivation layer to form at the inside wall of the quartz tube.

SUMMARY OF THE INVENTION

The present invention is arranged to provide a method of the type described wherein a high edge concentration in the p-region into which diffusion is to be carried out as well as short diffusion times for the vacuum diffusion step can be achieved without the necessity of providing a passivation step. The method of the present invention broadly consists in positioning the semiconductor body within a hollow silicon member along with vaporizable sources of aluminum and boron, then positioning the hollow silicon member within a refractory tube, evacuating the refractory tube, and heating the interior of the tube for a time and at a temperature sufficient to diffuse both aluminum and boron into the semiconductor body.

In a preferred form of the invention, the hollow silicon member consists of two hollow cylinder portions having wafers of silicon closing off the end faces of the hollow cylinder. A particularly preferred form of the invention consists in using pre-deposited coatings of aluminum and boron on the interior surfaces of the hollow silicon member as the vaporizable sources of aluminum and boron.

The diffusion method of the present invention may be followed by a second diffusion step at a higher temperature than the initial diffusion step to drive the dopants farther into the semiconductor body. In another embodiment of the present invention, portions of the dopant coating arising from the initial diffusing step are selectively etched away prior to carrying out the second diffusion step.

BRIEF DESCRIPTION OF THE DRAWING

The present invention will be set forth in greater detail with reference to the attached drawing in which.

DESCRIPTION OF THE PREFERRED EMBODIMENTS

Figure 1:
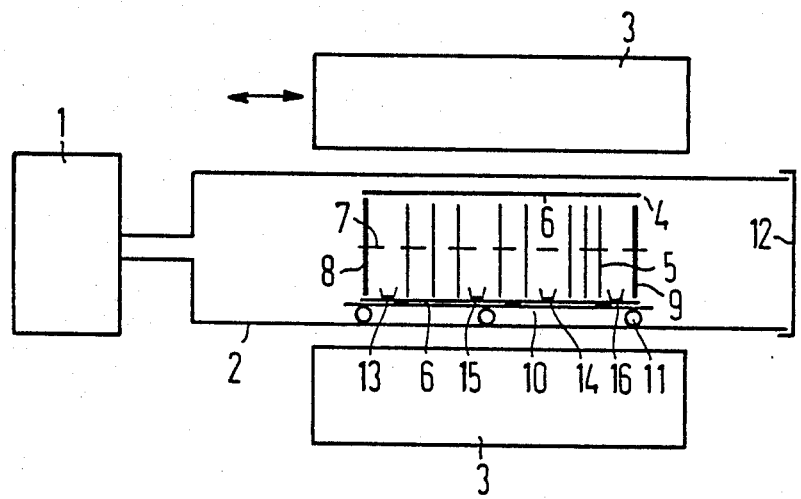
FIG. 1 illustrates schematically a diffusion apparatus suitable for carrying out the method of the present invention.

The diffusion apparatus schematically shown in FIG. 1 includes a quartz tube 2 which communicates with a vacuum pump 1, the quartz tube 2 being surrounded by a displaceable diffusion furnace 3. A hollow member 4 of silicon is located in the inside of the quartz tube 2, the hollow member 4 receiving a plurality of wafer shaped n-doped semiconductor bodies 5 of silicon into which the p-conductive regions are to be diffused. The hollow member 4 is preferably composed of a hollow cylinder formed by a lower and an upper silicon half shell 6. The parting plane between the two half shells is indicated in FIG. 1 with a broken line 7. End disks 8 and 9 composed of silicon are detachably connected to the silicon half shells 6 at the two end faces of the hollow cylinder 4. The hollow cylinder 4 is arranged on a carrier or platen 10 which is seated on rollers 11 in the quartz tube 2 in longitudinally displaceable fashion. When an end closure 12 of the quartz tube has been removed, the hollow member 4 can be withdrawn from the quartz tube 2. The upper half shell 6 can then be removed so that the n-doped semiconductor wafers 5 can be inserted into slot-like recesses of the lower half shell 6.

In a particular embodiment of the method of the invention, there is provided a plurality of crucibles 13 and 14 composed of alumina which contain aluminum powder or aluminum particles, as well as additional crucibles 15 and 16 in which boron powder is situated, the crucibles being located on the lower half shell 6. The crucibles 13 to 16 are distributed as uniformly as possible over the entire length of the half shells. The hollow cylinder 4 is then closed by inserting the upper half shell 6 and is located in the quartz tube 2 which is likewise closed by putting the end closure 12 in place. After the quartz tube 2 has been evacuated to a residual pressure of below $10^{-6}$ Torr, the diffusion furnace 3 which is displaceable in the direction of the double arrow is then brought into the position illustrated in FIG. 1 in which it overlaps the hollow member 4 by about the same dimension at both ends. Subsequently, the semiconductor wafers 5 are heated to a predetermined diffusion temperature of, for example, 1050° C. over a predetermined diffusion time of, for example, 4 hours. The dopants aluminum and boron thereby diffuse into the parts of the semiconductor wafers 5 without using doping masks, and form p-semiconductor regions therein.

Regions of p-semiconductors having adequately high edge concentration and penetration depth can be produced with the diffusion methods set forth above, and a good reproducibility of the two parameters is possible. The reproducibility of the edge concentration is concerned with the fact that the solubility limit of boron in silicon is reached, and the reproducibility of the penetration depth is accomplished from the ability to control the overall aluminum dosage which is diffused into the body. The short diffusion times of known vacuum aluminum diffusion methods are preserved without, however, requiring a passivation step which greater increases the overall cost. This is achieved by virtue of the hollow member 4 of silicon which largely prevents an emergence of the generated aluminum vapor and thus an interaction of the aluminum with the inside walls of the quartz tube and largely prevents a reduction in the partial aluminum pressure which is connected therewith.

A modification of the invention provides that the introduction of the crucibles 13 to 16 which serve as dopant sources is eliminated before the actual diffusion step and is replaced by a pre-lining of the inside walls of the hollow member 4 with the dopants, i.e., with aluminum and boron. The inside walls of the hollow member 4 themselves then serve as dopant sources. To accomplish this result, the dopants are deposited in the hollow member 4 without the semiconductor wafers 5 being present, and the hollow member 4 is then subjected to a diffusion step after being introduced into the quartz tube 2 and after the evacuation of the quartz tube. The diffusion step requires a time of about 50 hours and is carried out at a temperature of, for example, 1050° C. Such a pre-lining guarantees an extremely uniform diffusion at all semiconductor wafers and virtually excludes alloying of the surfaces of the silicon wafers 5 which may lead to inhomogeneities and defects. The hollow member 4 which has been pre-lined once can be used to perform a number of diffusion methods according to the present invention. A modification of this embodiment involves a pre-lining only with aluminum, and the second dopant boron is introduced into the hollow member 5 with the crucibles 15 and 16 before the actual diffusion step referred to previously. The diffusion method described above can be particularly advantageously utilized within the framework of the invention to implement vacuum coating of n-conductive semiconductor bodies with dopants required for the formation of a p-semiconductor region. By means of such a coating which is also referred to as "predeposition" dopants are introduced into the surface-side zone of the semiconductor body such as a silicon wafer 5. The penetration depth of the zone or the amount of coating layer, for example, extends in the range from 5 to 10 microns. In order to achieve this result, the diffusion time is limited to about 2 hours with a coating temperature of about 1050° C. The coating thus obtained represents a first step of a two-step diffusion method wherein the second step serves the purpose of driving the dopants thus introduced into the relatively flat coating more deeply into the semiconductor body. This occurs with what is known as a tempering step wherein the semiconductor body is exposed to a higher temperature of, for example, 1240° C. during a predetermined time interval of, for example, 15 to 20 hours during which the dopant sources are removed. The dopant atoms introduced during the intial coating thereby diffuse out of the zone further into the part of the semiconductor body which lies beneath the zone.

The advantage of increasing the edge concentration by the addition of boron is particularly effective in such a two-stage diffusion process since the aluminum edge concentration decreases greatly during the subsequent drive-in step due to outward diffusion of the aluminum from the semiconductor bodies to be doped.

The low penetration depth of the resulting coating layer or the zone obtainable with the coating produces the significant advantage that this coating layer can be structured in a relatively simple way in order to obtain a laterally structured p-region after the drive-in step.

Figure 2:
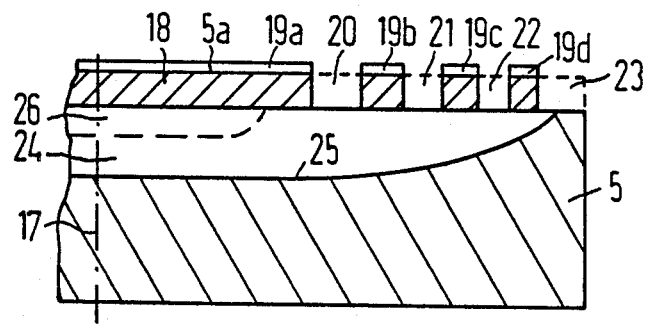
FIG. 2 is a greatly enlarged cross-sectional view of a semiconductor member manufactured in accordance with the present invention.

As an example of such structuring, FIG. 2 shows a wafer-shaped silicon semiconductor body 5 having the shape of a flat wafer with a circular cross-section. The vertical axis through the center of the cross-sectional surface is identified at reference numeral 17. The semiconductor body 5 is provided with a zone 18 which is about 5 to 10 microns thick at its upper boundary surface 5a. The zone 18 represents a coating layer containing the dopants aluminum and boron. When the coating layer is covered with a mask composed of individual parts 19a through 19d, and when the parts 20 to 23 of the coating layer which are not covered by the mask parts are etched away, then the possibility arises of generating a p-semiconductor region 24 in a subsequent tempering or drive-in step which is separated from the remaining portion of the semiconductor body by a pn-junction 25. The pn-junction 25 under the recesses 20 to 23 thereby gradually approaches the boundary surface 5a, so that high blocking voltages can be applied to the junction 25. Since the zone 18 produced according to the vacuum coating in accordance with the invention can be very precisely adjusted both in terms of edge concentration as well as in the overall quantity of dopant introduced, the adjustability being possible by controlling the diffusion time used and the diffusion temperature, the etching process can be correlated to obtaining a predetermined penetration depth in the zone 18. The semiconductor body 5 shown in FIG. 2 constitutes the collector, the p-semiconductor region 24 represents the base and an n-doped semiconductor region 26 introduced therein, this being indicated with a broken line in FIG. 2, represents the emitter of a vertical transistor. A readily reproducable base resistance due to the favorable distribution of the conductivity in the depth of the p-doped layer 24 results because of the good controllability of the dopant concentration existing immediately under the n-doped region 26. Thus, there is produced a high aluminum concentration and at the same time a relatively low boron concentration due to the slight penetration depth of the boron.

The principles of two stage diffusion are fundamentally known, for example, from the book by R. M. Warner entitled "Integrated Circuits" McGraw Hill Book Company, New York, 1965, in particular, page 294.

It will be understood that various modifications can be made to the described embodiments without departing from the scope of the present invention.

We claim as our invention:

1. A method of producing a p-doped semiconductor region in an n-conductive silicon body which comprises:

positioning said silicon body within a hollow silicon member comprising a two part hollow cylinder having end disk of silicon closing off its end faces along with a vaporizable source of aluminum and boron.

then positioning the hollow silicon member within a refractory tube, evacuating said refractory tube, and heating the interior of said tube for a time and at a temperature sufficient to diffuse both aluminum and boron into said silicon body.

2. A method accordin to claim 1, wherein said vaporizable sources comprise pre-deposited coatings of aluminum and boron on the interior surfaces of said hollow silicon member.

3. A method according to claim 1, wherein the diffusing step is followed by a second diffusing step at a higher temperature than the initial diffusing step to drive the dopant coating from the initial diffusing step farther into said semiconductor body.

4. A method according to claim 3 which includes the step of selectively etching away portions of the dopant coating from the initial diffusing step prior to carrying out said second diffusing step.

* * * * *